(12) United States Patent
Kobayashi et al.

(10) Patent No.: US 9,533,467 B2
(45) Date of Patent: Jan. 3, 2017

(54) IMPRINT MATERIAL HAVING LOW MOLD RELEASE PROPERTY

(71) Applicant: NISSAN CHEMICAL INDUSTRIES, LTD., Tokyo (JP)

(72) Inventors: Junpei Kobayashi, Funabashi (JP); Taku Kato, Funabashi (JP); Keisuke Shuto, Funabashi (JP); Masayoshi Suzuki, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/395,903

(22) PCT Filed: Apr. 16, 2013

(86) PCT No.: PCT/JP2013/061291
§ 371 (c)(1),
(2) Date: Oct. 21, 2014

(87) PCT Pub. No.: WO2013/161630
PCT Pub. Date: Oct. 31, 2013

(65) Prior Publication Data
US 2015/0321445 A1 Nov. 12, 2015

(30) Foreign Application Priority Data

Apr. 27, 2012 (JP) .................. 2012-103953
Jul. 19, 2012 (JP) .................. 2012-160573
Oct. 2, 2012 (JP) .................. 2012-220244

(51) Int. Cl.
| | | |
|---|---|---|
| B32B 3/30 | (2006.01) |
| C08J 5/18 | (2006.01) |
| H01L 31/0236 | (2006.01) |
| H01L 27/146 | (2006.01) |
| C09D 4/00 | (2006.01) |
| C08F 222/10 | (2006.01) |
| G03F 7/00 | (2006.01) |
| G03F 7/027 | (2006.01) |
| G03F 7/038 | (2006.01) |
| G03F 7/075 | (2006.01) |
| B82Y 10/00 | (2011.01) |
| B82Y 40/00 | (2011.01) |

(52) U.S. Cl.
CPC .................. *B32B 3/30* (2013.01); *B82Y 10/00* (2013.01); *B82Y 40/00* (2013.01); *C08F 222/1006* (2013.01); *C08J 5/18* (2013.01); *C09D 4/00* (2013.01); *G03F 7/0002* (2013.01); *G03F 7/027* (2013.01); *G03F 7/038* (2013.01); *G03F 7/0757* (2013.01); *H01L 27/14625* (2013.01); *H01L 31/02366* (2013.01); *C08J 2333/06* (2013.01); *Y10T 428/24802* (2015.01)

(58) Field of Classification Search
CPC ................................................. H01L 27/14625
See application file for complete search history.

(56) References Cited

U.S. PATENT DOCUMENTS 5,772,905 A    6/1998   Chou

FOREIGN PATENT DOCUMENTS

| JP | 2008105414 A | | 5/2008 | |
| JP | 2008202022 A | * | 9/2008 | ............... C08F 2/44 |
| JP | 2013008825 A | | 1/2013 | |

OTHER PUBLICATIONS

Jun. 11, 2013 Written Opinion issued in International Application No. PCT/JP2013/061291.
Jun. 11, 2013 Search Report issued in International Application No. PCT/JP2013/061291.

* cited by examiner

*Primary Examiner* — Betelhem Shewareged
(74) *Attorney, Agent, or Firm* — Oliff PLC

(57) ABSTRACT

There is provided an imprint material that allows a resin film to be readily released from a mold at the time of mold release after curing, that is, an imprint material that forms a film having a low mold release property as well as high transparency, high scratch resistance, and a high fingerprint wiping-off property; and a film which is formed from the material and to which a pattern is transferred. An imprint material including: a (A) component: a compound having a propylene oxide unit and two polymerizable groups or a compound having a propylene oxide unit, an ethylene oxide unit, and two polymerizable groups; a (B) component: a silicone compound; and a (C) component: a photopolymerization initiator.

16 Claims, No Drawings

IMPRINT MATERIAL HAVING LOW MOLD RELEASE PROPERTY

TECHNICAL FIELD

The present invention relates to an imprint material (a film forming composition for imprint) and a film that is formed from the material and to which a pattern is transferred. More specifically, the present invention relates to an imprint material that allows a resin film to be readily released from a mold at the time of mold release after curing and relates to a film that is formed from the material and to which a pattern is transferred.

BACKGROUND ART

In 1995, Professor Chou et al. of current Princeton University have developed a new technology called nano-imprint lithography (Patent Document 1). The nano-imprint lithography is a technology in which an intended pattern is formed on the cured resin film by bringing a mold having any patterns into contact with a substrate on which a resin film is formed, pressurizing the resin film, and using heat or light as external stimulus. This nano-imprint lithography has advantages that nano-scale processing can be easily and inexpensively carried out as compared with photo-lithography in conventional semiconductor device production.

Therefore, instead of the photo-lithography, the nano-imprint lithography is a technology expected for application in a semiconductor device, an opto-device, a display, a memory medium, a bio-chip, and so forth. Thus, various curable compositions for photo-nano-imprint lithography used for nano-imprint lithography have been disclosed (Patent Document 2 and Patent Document 3).

When a costly mold is used in the nano-imprint lithography, the mold is required to have longer lifetime. However, when peeling force of the mold from the cured resin film, that is, peeling force at the time of mold release (hereinafter abbreviated as "mold release force" in this specification) is large, a resin is easily attached to the mold and thus the mold tends to be unable to use. Therefore, a low mold release property (a property that a cured resin film is easily peeled from a mold) is required for the material used for the nano-imprint lithography (hereinafter abbreviated as an "imprint material" in this specification). Although various materials have been disclosed as the imprint materials, the materials having low mold release force have not been investigated or disclosed. For a product such as a solid state imaging device, a solar cell, an LED (light emitting diode) device, and a display, scratch resistance and high transparency may be required at the same time for a structure prepared as an optical member inside or at the surface of the product.

PRIOR ART DOCUMENTS

Patent Documents

Patent Document 1: U.S. Pat. No. 5,772,905
Patent Document 2: Japanese Patent Application Publication No. 2008-105414 (JP 2008-105414 A)
Patent Document 3: Japanese Patent Application Publication No. 2008-202022 (JP 2008-202022 A)

SUMMARY OF THE INVENTION

Problem to be Solved by the Invention

The present invention has been achieved based on the above described situations, and an object of the present invention is to provide an imprint material that allows a resin film to be readily released from a mold at the time of mold release after curing, that is, an imprint material that forms a film having a low mold release property as well as high transparency, high scratch resistance, and a high fingerprint wiping-off property, and to provide a film which is formed from the material and to which a pattern is transferred. Specifically, an object of the present invention is to provide an imprint material that forms a film having a mold release force of more than 0 g/cm and 0.5 g/cm or less, an average transmittance in the visible light region of 99% or more, and 10 or fewer scratches after a scratch test has been carried out using steel wool to the film to which a pattern has been transferred.

Means for Solving the Problem

As a result of intensive investigation for solving the above problems, the inventors of the present invention have found the following astonishing findings. The use of a material containing a compound at least having a propylene oxide unit and having polymerizable groups, a silicone compound, and a photopolymerization initiator as the imprint material, significantly reduces the mold release force measured at the time of peeling from the surface of the mold having the unevenness the cured film to which a pattern of the unevenness of the mold is transferred by photo-curing on the surface of the mold having unevenness. In addition, scratch formation is low when the scratch test using steel wool is carried out to the pattern of the film which is formed from the material and to which the pattern is transferred, and the film has an excellent fingerprint wiping-off property and excellent transparency. Thus, the inventors of the present invention have accomplished the present invention.

Specifically, the present invention relates to, as a first aspect, an imprint material comprising: a (A) component; a (B) component; and a (C) component in which the (A) component is a compound having a propylene oxide unit and two polymerizable groups or a compound having a propylene oxide unit, an ethylene oxide unit, and two polymerizable groups,
the (B) component is a silicone compound, and
the (C) component is a photopolymerization initiator.

The present invention relates to, as a second aspect, the imprint material according to the first aspect, further comprising a compound having three or more polymerizable groups, as a (D) component.

The present invention relates to, as a third aspect, the imprint material according to the first aspect or the second aspect, further comprising a compound having an ethylene oxide unit and two polymerizable groups, as an (E) component.

The present invention relates to, as a fourth aspect, the imprint material according to any one of the first aspect to the third aspect, further comprising a surfactant as an (F) component.

The present invention relates to, as a fifth aspect, the imprint material according to any one of the first aspect to the fourth aspect, further comprising a solvent as a (G) component.

The present invention relates to, as a sixth aspect, the imprint material according to any one of the first aspect to the fifth aspect, in which the compound of the (A) component is a compound having two groups of at least one selected from the group consisting of an acryloyloxy group, a methacryloyloxy group, a vinyl group, and an allyl group, as the polymerizable groups.

The present invention relates to, as a seventh aspect, the imprint material according to the second aspect, in which the compound of the (D) component is a compound having three or more groups of at least one selected from the group consisting of an acryloyloxy group, a methacryloyloxy group, a vinyl group, and an allyl group, as the polymerizable groups.

The present invention relates to, as an eighth aspect, the imprint material according to any one of the first to the seventh aspect, in which in a test in which the imprint material is applied onto a film, the coating film on the film is bonded to the surface of a mold having unevenness, subsequently the coating film is photo-cured, and thereafter the cured film on the film is peeled at 90° from the surface of the mold having unevenness, a measured mold release force is more than 0 g/cm and 0.5 g/cm or less, the measured mold release force being a value obtained by converting a load when the cured film on the film is peeled from the surface of the mold having unevenness into a value per 1 cm of the width of the film.

The present invention relates to, as a ninth aspect, a film which is formed from the imprint material as described in any one of the first aspect to the eighth aspect and to which a pattern is transferred.

The present invention relates to, as a tenth aspect, an optical member comprising: the film as described in the ninth aspect to which the pattern is transferred and which is provided on a substrate.

The present invention relates to, as an eleventh aspect, a solid state imaging device comprising: the film as described in the ninth aspect to which the pattern is transferred and which is provided on a substrate.

The present invention relates to, as a twelfth aspect, an LED device comprising: the film as described in the ninth aspect to which the pattern is transferred and which is provided on a substrate.

The present invention relates to, as a thirteenth aspect, a semiconductor device comprising: the film as described in the ninth aspect to which the pattern is transferred.

The present invention relates to, as a fourteenth aspect, a solar cell comprising: the film as described in the ninth aspect to which the pattern is transferred and which is provided on a substrate.

The present invention relates to, as a fifteenth aspect, a display comprising: the film as described in the ninth aspect to which the pattern is transferred and which is provided on a substrate.

The present invention relates to, as a sixteenth aspect, an electronic device comprising: the film as described in the ninth aspect to which the pattern is transferred and which is provided on a substrate.

Effects of the Invention

The imprint material of the present invention includes a compound having a propylene oxide unit or both a propylene oxide unit and an ethylene oxide unit, as well as two polymerizable groups in one molecule and a silicone compound. Therefore, the cured film formed from the imprint material has the low mold release property and the high scratch resistance, the high fingerprint wiping-off property, and the high transparency.

The imprint material of the present invention can be cured by light and does not cause peeling of a part of the pattern when the film is peeled from the surface of the mold having unevenness. Thus, a film on which a desired pattern is precisely formed can be obtained. Therefore, the excellent pattern formation of photo-imprint can be achieved.

A film formed from the imprint material of the present invention can be formed onto any substrates. A pattern transferred film formed after imprint can be suitably used for products such as a solar cell, an LED device, and a display that use members requiring the scratch resistance, the high fingerprint wiping-off property, and the high transparency.

By changing the type and the content ratio of the compound of the (A) component, the curing rate, the dynamic viscosity, and the film thickness of the imprint material of the present invention can be controlled. Therefore, a material fitting to a type of a device to be produced and types of an exposure process and a baking process can be designed with the imprint material of the present invention. This enables the process margin to be enlarged and thus the imprint material can be suitably used for production of optical members.

MODES FOR CARRYING OUT THE INVENTION

<(A) Component>

The compound of the (A) component indicates a compound having one or more of propylene oxide units or one or more of each of propylene oxide units and ethylene oxide units, and having two polymerizable groups in one molecule, specifically, having the two polymerizable groups at both ends of the compound. Examples of the propylene oxide unit include ($-CH(CH_3)CH_2O-$) and ($-CH_2CH_2CH_2O-$) and examples of the ethylene oxide unit include ($-CH_2CH_2O-$). Examples of the polymerizable groups include an acryloyloxy group, a methacryloyloxy group, a vinyl group, and an allyl group. The acryloyloxy group may be called an acryloxy group and the methacryloyloxy group may be called a methacryloxy group.

Examples of the compound of the (A) component include dipropylene glycol di(meth)acrylate, tripropylene glycol di(meth)acrylate, polypropylene glycol #400 di(meth)acrylate, polypropylene glycol #700 di(meth)acrylate, ethylene oxide-propylene oxide copolymer di(meth)acrylic acid esters, and ethoxylated polypropylene glycol #700 di(meth) acrylate. In this specification, the (meth)acrylate compound indicates the acrylate compound and the methacrylate compound. For example, (meth)acrylic acid indicates acrylic acid and methacrylic acid.

The compound is commercially available and specific examples of the compound include NK Ester APG-100, NK Ester APG-200, NK Ester APG-400, NK Ester APG-700, NK Ester 3PG, NK Ester 9PG, NK Ester 1206PE, NK Economer A-1000PER (mentioned above are manufactured by Shin-Nakamura Chemical Co., Ltd.), FANCRYL (registered trademark) FA-P240A, FANCRYL FA-P270A, FANCRYL FA-023M (mentioned above are manufactured by Hitachi Chemical Industry Co. Ltd).

The compounds of the (A) component can be used singly or in combination of two or more of them.

The (A) component in the present invention can provide the scratch resistance to the film after pattern transfer and assists bleed-out of the silicone compound of the (B) component described below at the time of curing at imprint. Whereby the mold release force can be reduced which is measured at the time of peeling the resin film (cured film) from the surface of the mold having unevenness.

By changing the type and the content ratio of the compound of the (A) component, the dynamic viscosity of the imprint material and the curing rate and the thickness of the formed film at the time of imprint can be controlled.

<(B) Component>

The silicone compound of the (B) component is a compound having a silicone framework (siloxane framework) in the molecule and particularly preferably has a dimethylsilicone framework.

The compound is commercially available and specific examples of the compound include BYK-302, BYK-307, BYK-322, BYK-323, BYK-330, BYK-333, BYK-370, BYK-375, BYK-378, BYK-UV 3500, and BYK-UV 3570 (mentioned above are manufactured by BYK Japan KK), X-22-164, X-22-164AS, X-22-164A, X-22-164B, X-22-164C, X-22-164E, X-22-163, X-22-169AS, X-22-174DX, X-22-2426, X-22-9002, X-22-2475, X-22-4952, KF-643, X-22-343, X-22-2404, X-22-2046, and X-22-1602 (mentioned above are manufactured by Shin-Etsu Chemical Co., Ltd.).

The compounds having the silicone framework can be used singly or in combination of two or more of them.

The content of the (B) component in the imprint material of the present invention is preferably 0.2 phr to 4 phr and more preferably 0.5 phr to 2 phr to the mass of the (A) component or the total mass of the (A) component and the (D) component when the compound includes the (D) component described below. The ratio of less than 0.2 phr results in insufficient low mold release property, whereas the ratio of more than 4 phr may result in insufficient curing and thus a patterning property deteriorates. The term "phr" means the mass of the (B) component (silicone compound) to a mass of the (A) component of 100 g or a total mass of the (A) component and the (D) component of 100 g.

<(C) Component>

The photopolymerization initiator of the (C) component is not limited as long as photopolymerization initiators absorb light from the light source used at the time of photo-curing. Examples of the photopolymerization initiator include: organic peroxides such as tert-butylperoxy-iso-phthalate, 2,5-dimethyl-2,5-bis(benzoyldioxy)hexane, 1,4-bis[α-(tert-butyldioxy)-iso-propoxy]benzene, di-tert-butylperoxide, 2,5-dimethyl-2,5-bis(tert-butyldioxy)hexene hydroperoxide, α-(iso-propylphenyl)-iso-propyl hydroperoxide, tert-butyl hydroperoxide, 1,1-bis(tert-butyldioxy)-3,3,5-trimethylcyclohexane, butyl-4,4-bis(tert-butyldioxy)valerate, cyclohexanone peroxide, 2,2',5,5'-tetra(tert-butylperoxycarbonyl) benzophenone, 3,3',4,4'-tetra(tert-butylperoxycarbonyl) benzophenone, 3,3',4,4'-tetra(tert-amylperoxycarbonyl) benzophenone, 3,3',4,4'-tetra(tert-hexylperoxycarbonyl) benzophenone, 3,3'-bis(tert-butylperoxycarbonyl)-4,4'-dicarboxybenzophenone, tert-butylperoxy benzoate, and di-tert-butyldiperoxy isophthalate; quinones such as 9,10-anthraquinone, 1-chloroanthraquinone, 2-chloroanthraquinone, octamethylanthraquinone, and 1,2-benzanthraquinone; benzoin derivatives such as benzoin methyl, benzoin ethyl ether, α-methylbenzoin, and α-phenylbenzoin; alkylphenone-based compounds such as 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-[4-{4-(2-hydroxy-2-methyl-propionyl) benzyl}-phenyl]-2-methyl-propan-1-one, phenylglyoxylic acid methyl ester, 2-methyl-1-[4-(methylthio)phenyl]-2-morpholinopropan-1-one, 2-benzyl-2-dimethylamino-1-(4-morpholinophenyl)-butan-1-one, and 2-dimethylamino-2-(4-methyl-benzyl)-1-(4-morpholin-4-yl-phenyl)-butan-1-one; acyl phosphine oxide-based compounds such as bis(2,4,6-trimethylbenzoyl)-phenylphosphine oxide and 2,4,6-trimethylbenzoyl-diphenyl-phosphine oxide; and oxime ester-based compounds such as 1,2-octanedione-1-[4-(phenylthio)-,2-(O-benzoyloxime)], and ethanone-1-[9-ethyl-6-(2-methylbenzoyl)-9H-carbazol-3-yl]-,1-(O-acetyloxime).

The compound is commercially available and specific examples of the compound include IRGACURE (registered trademark) 651, IRGACURE 184, IRGACURE 500, IRGACURE 2959, IRGACURE 127, IRGACURE 754, IRGACURE 907, IRGACURE 369, IRGACURE 379, IRGACURE 379EG, IRGACURE 819, IRGACURE 819DW, IRGACURE 1800, IRGACURE 1870, IRGACURE 784, IRGACURE OXE01, IRGACURE OXE02, IRGACURE 250, Darocur (registered trademark) 1173, Darocur MBF, Darocur 4265, Lucirin (registered trademark) TPO (mentioned above are manufactured by BASF Japan Ltd.), KAYACURE (registered trademark) DETX, KAYACURE MBP, KAYACURE DMBI, KAYACURE EPA, KAYACURE OA (mentioned above are manufactured by Nippon Kayaku Co., Ltd.), VICURE-10, VICURE 55 (mentioned above are manufactured by Stauffer Co. Ltd.), ESACURE (registered trademark) KIP150, ESACURE TZT, ESACURE 1001, ESACURE KTO46, ESACURE KB1, ESACURE KL200, ESACURE KS300, ESACURE EB3, Triazine-PMS, Triazine A, Triazine B (mentioned above are manufactured by Japan Siber-Hegner KK), ADEKA OPTOMER N-1717, ADEKA OPTOMER N-1414, and ADEKA OPTOMER N-1606 (manufactured by ADEKA CORPORATION).

The photopolymerization initiators can be used singly or in combination of two or more of them.

The content of the (C) component in the imprint material of the present invention is preferably 0.1 phr to 30 phr and more preferably 1 phr to 20 phr to the mass of the (A) component or the total mass of the (A) component and the (D) component when the compound includes the (D) component described below. This is because the ratio of the content of the (C) component of less than 0.1 phr results in an insufficient curing property and thus deterioration in the patterning property and reduction in the scratch resistance occur. The term "phr" means the mass of photopolymerization initiator to a mass of the (A) component of 100 g or a total mass of the (A) component and the (D) component of 100 g.

<(D) Component>

In the present invention, the compound having three or more polymerizable groups may be added as the (D) component. The compound having three or more polymerizable groups of the (D) component plays a role of adjusting hardness of the film obtained by photo-imprint. The number of the polymerizable groups in the compound having three or more polymerizable groups is, for example, three to six. Examples of the polymerizable groups include an acryloyloxy group, a methacryloyloxy group, a vinyl group, and an allyl group.

Examples of the compound of the (D) component include pentaerythritol triacrylate, trimethylolpropane tri(meth) acrylate, ethoxylated trimethylolpropane triacrylate, ethoxylated glycerin triacrylate, ethoxylated isocyanuric acid triacrylate, 6-caprolactone-modified tris-(2-acryloxyethyl) isocyanurate, pentaerythritol tetraacrylate, ethoxylated pentaerythritol tetraacrylate, ditrimethylolpropane tetraacrylate, dipentaerythritol hexaacrylate, ethoxylated dipentaerythritol hexaacrylate, dipentaerythritol polyacrylate, polyglycerin polyethylene glycol polyacrylate, a pentaerythritol triacrylate hexamethylene diisocyanate urethane prepolymer, a pentaerythritol triacrylate toluene diisocyanate urethane prepolymer, a pentaerythritol triacrylate isophorone diisocyanate urethane prepolymer, and a dipentaerythritol pentaacrylate hexamethylene diisocyanate urethane prepolymer.

The compound is commercially available and specific examples of the compound may include NK Ester A-TMM-3LMN, NK Ester A-TMPT, NK Ester TMPT, NK Ester A-TMPT-3Eo, NK Ester A-GLY-3E, NK Ester A-GLY-9E, NK Ester A-GLY-20E, NK Ester A-9300, NK Ester A-9300-1CL, NK Ester A-9300-6CL, NK Ester A-TMMT, NK Ester ATM-4E, NK Ester ATM-35E, NK Ester AD-TMP, NK Ester A-DPH, NK Ester A-DPH-12E, NK Ester A-9550, NK Ester A-9530, NK Ester ADP-51EH, NK Ester ATM-31EH, NK Economer A-PG5027E, NK Economer A-PG5054E (mentioned above are manufactured by Shin-Nakamura Chemical Co., Ltd.), KAYARAD (registered trademark) T-1420, KAYARAD D-330, KAYARAD D-310, KAYARAD DPCA-20, KAYARAD DPCA-30, KAYARAD DPCA-60, KAYARAD DPCA-120, KAYARAD GPO-303, KAYARAD TMPTA, KAYARAD THE-330, KAYARAD TPA-320, KAYARAD TPA-330, KAYARAD PET-30, KAYARAD RP-1040, KAYARAD DPHA, KAYARAD DPHA-2C, KAYARAD DN-0075, KAYARAD DN-2475, KAYARAD DPEA-12 (mentioned above are manufactured by Nippon Kayaku Co., Ltd.), UA-306H, UA-306T, UA-306I, and UA-510H (mentioned above are manufactured by Kyoeisha Chemical Co., Ltd.).

The compounds having three or more polymerizable groups can be used singly or in combination of two or more of them. When the compound having three or more polymerizable groups is used, the ratio of the compound is preferably 10 phr to 70 phr and more preferably 40 phr to 60 phr to the mass of the (A) component.

<(E) Component>

In the present invention, the compound having an ethylene oxide unit and having two polymerizable groups may be added as the (E) component. Addition of the (E) component can further promote reduction in mold release force. The compound having an ethylene oxide unit and having two polymerizable groups of the (E) component indicates a compound having one or more of ethylene oxide units and having two polymerizable groups in one molecule, specifically, having polymerizable groups at both ends of the compound. The ethylene oxide unit is, for example, (—$CH_2CH_2O$—). Examples of the polymerizable group include an acryloyloxy group, a methacryloyloxy group, a vinyl group, and an allyl group.

Examples of the compound of the (E) component include monoethylene glycol di(meth)acrylate, diethylene glycol di(meth)acrylate, triethylene glycol di(meth)acrylate, tetraethylene glycol di(meth)acrylate, polyethylene glycol #200 di(meth)acrylate, polyethylene glycol #300 di(meth)acrylate, polyethylene glycol #400 di(meth)acrylate, polyethylene glycol #600 di(meth)acrylate, polyethylene glycol #1000 di(meth)acrylate, and ethoxylated bisphenol A di(meth)acrylate.

The compound is commercially available and specific examples of the compound include NK Ester 1G, NK Ester 2G, NK Ester 3G, NK Ester 4G, NK Ester 9G, NK Ester 14G, NK Ester 23G, NK Ester A-200, NK Ester A-400, NK Ester A-600, NK Ester A-1000, NK Ester ABE-300, NK Ester A-BPE-4, NK Ester A-BPE-6, NK Ester A-BPE-10, NK Ester A-BPE-17, NK Ester A-BPE-30, NK Ester BPE-80N, NK Ester BPE-100N, NK Ester BPE-200, NK Ester BPE-500, NK Ester BPE-900, and NK Ester BPE-1300N (mentioned above are manufactured by Shin-Nakamura Chemical Co., Ltd.), NEW FRONTIER (registered trademark) PE-200, NEW FRONTIER PE-300, NEW FRONTIER PE-400, and NEW FRONTIER PE-600 (mentioned above are manufactured by DAI-ICHI KOGYO SEIYAKU CO., LTD.).

The compounds having an ethylene oxide unit and having two polymerizable groups can be used singly or in combination of two or more of the compounds. When the compound having an ethylene oxide unit and having two polymerizable groups is used, the ratio of the compound is preferably 5% by mass or more and 35% by mass or less to the total compounds having polymerizable groups in the imprint material of the present invention. The total amount to the total compounds having polymerizable groups of less than 5% by mass hardly affects reduction in mold release force, whereas the total amount of more than 35% by mass causes adhesion of patterns together at the time of release and thus the shape deteriorates.

<(F) Component>

In the present invention, a surfactant may be added as the (F) component. The surfactant of the (F) component plays a role of adjusting a film forming property of the obtained coating film.

Examples of the surfactant include: nonionic surfactant such as polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as Eftop (registered trademark) EF301, Eftop EF303, Eftop EF352 (manufactured by Mitsubishi Materials Electronic Chemicals Co., Ltd (previous JEMCO Inc.)), Megafac (registered trademark) F171, Megafac F173, Megafac R-08, Megafac R-30 (manufactured by DIC Corporation), Fluorad FC430, Fluorad FC431 (manufactured by Sumitomo 3M Ltd.), Asahi guard (registered trademark) AG710, Surflon (registered trademark)S-382, Surflon SC101, Surflon SC102, Surflon SC103, Surflon SC104, Surflon SC105, Surflon SC106 (manufactured by Asahi Glass Co., Ltd.); and Organosiloxane Polymer KP341 (manufactured by Shin-Etsu Chemical Co., Ltd.).

The surfactants can be used singly or in combination of two or more of them. When the surfactant is used, the ratio is preferably 0.01 phr to 40 phr and more preferably 0.01 phr to 10 phr to the mass of the (A) component or the total mass of the (A) component and the (D) component or the total mass of the (A) component and the (E) component or the total mass of the (A) component, the (D) component, and the (E) component.

<(G) Component>

In the present invention, a solvent may be added as the (G) component. The solvent of the (G) component plays a role of adjusting viscosities of the compound of the (A) component having a propylene oxide unit or both a propylene oxide unit and an ethylene oxide unit as well as two polymerizable groups in a molecule and the compound of the (D) component having three or more of the polymerizable groups.

Examples of the solvent include toluene, p-xylene, o-xylene, styrene, ethylene glycol dimethyl ether, propylene glycol monomethyl ether, ethylene glycol monomethyl ether, propylene glycol monoethyl ether, ethylene glycol monoethyl ether, ethylene glycol mono-isopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, 2-heptanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, trimethylene glycol, 1-methoxy-2-butanol, isopropyl ether, 1,4-dioxane, N,N-dimethylformamide, N,N-dimethylacetamide, N-methyl-2-pyrrolidone, 1,3-dimethyl-2-imidazolidinone, dimethyl sulfoxide, and N-cyclohexyl-2-pyrrolidine. The solvent is not particularly limited as long as the solvent can adjust the viscosities of the (A) component and the (D) component.

The solvents can be used singly or in combination of two or more of them.

When the solvent is used, the solvent is preferably contained at the ratio of solid content of 20% by mass to 80% by mass and preferably 40% by mass to 60% by mass to the imprint material. The solid content is defined as the content after the solvent as the (G) component is removed from the total components of the imprint material of the present invention, that is, the total components of the (A) component to the (F) component and other additives described below.

<Other Additives>

As long as the effect of the present invention is not impaired, the imprint material of the present invention can contain an epoxy compound, a photoacid generator, a photosensitizer, an ultraviolet absorber, an antioxidant, an adhesion promoting agent, and mold release improver, if necessary.

Examples of the epoxy compound include Epolead (registered trademark) GT-401, Epolead PB3600, Celloxide (registered trademark) 2021P, Celloxide 2000, Celloxide 3000, Celloxide EHPE3150, Celloxide EHPE3150CE, Cyclomer (registered trademark) M100 (mentioned above are manufactured by DAICEL CORPORATION), EPICLON (registered trademark) 840, EPICLON 840-S, EPICLON N-660, and EPICLON N-673-80M (mentioned above are manufactured by DIC Corporation).

Examples of the photoacid generator include IRGACURE (registered trademark) PAG103, IRGACURE PAG108, IRGACURE PAG 121, IRGACURE PAG 203, IRGACURE CGI725 (mentioned above are manufactured by BASF Japan Ltd.), WPAG-145, WPAG-170, WPAG-199, WPAG-281, WPAG-336, WPAG-367 (mentioned above are manufactured by Wako Pure Chemical Industries, Ltd.), TFE Triazine, TME-Triazine, MP-Triazine, Dimethoxytriazine, TS-91, and TS-01 (manufactured by SANWA CHEMICAL CO., LTD.).

Examples of the photosensitizer may include thioxanthen-based, xanthene-based, ketone-based, thiopyrylium salt-based, base styryl-based, merocyanine-based, 3-substituted coumarin-based, 3,4-substituted coumarin-based, cyanine-based, acridine-based, thiazine-based, phenothiazine-based, anthracene-based, coronene-based, benzanthracene-based, perylene-based, ketocoumarin-based, coumarin-based, and borate-based photosensitizers.

The photosensitizers can be used singly or in combination of two or more of them. The absorbed wavelength of UV region can be adjusted by using the photosensitizer.

Examples of the ultraviolet absorber include TINUVIN (registered trademark) PS, TINUVIN 99-2, TINUVIN 109, TINUVIN 328, TINUVIN 384-2, TINUVIN 400, TINUVIN 405, TINUVIN 460, TINUVIN 477, TINUVIN 479, TINUVIN 900, TINUVIN 928, TINUVIN 1130, TINUVIN 111FDL, TINUVIN 123, TINUVIN 144, TINUVIN 152, TINUVIN 292, TINUVIN 5100, TINUVIN 400-DW, TINUVIN 477-DW, TINUVIN 99-DW, TINUVIN 123-DW, TINUVIN 5050, TINUVIN 5060, and TINUVIN 5151 (mentioned above are manufactured by BASF Japan Ltd.).

The ultraviolet absorbers can be used singly or in combination of two or more of them. By using the ultraviolet absorber, the curing rate of the outmost surface of the film can be controlled at the time of photo-curing and thus the mold release property may be improved.

Examples of the antioxidant include IRGANOX (registered trademark) 1010, IRGANOX 1035, IRGANOX 1076, IRGANOX 1135, and IRGANOX 1520L (mentioned above are manufactured by BASF Japan Ltd.).

The antioxidants can be used singly or in combination of two or more of them. By using the antioxidant, color change of the film in yellow caused by oxidation can be prevented.

Examples of the adhesion promoting agent include 3-methacryloxypropyltrimethoxysilane and 3-acryloxypropyltrimethoxysilane. By using the adhesion promoting agent, the adhesion to the substrate is improved. The content of the adhesion promoting agent is preferably 5 phr to 50 phr and more preferably 10 phr to 50 phr to the mass of the (A) component or the total mass of the (A) component and the (D) component or the total mass of the (A) component and the (E) component or the total mass of the (A) component, the (D) component, and the (E) component.

Examples of the mold release improver include a fluorine-containing compound. Examples of the fluorine-containing compound include R-5410, R-1420, M-5410, M-1420, E-5444, E-7432, A-1430, and A-1630 (mentioned above are manufactured by DAIKIN INDUSTRIES, LTD).

<Preparation of Imprint Material>

A method for preparing the imprint material of the present invention is not particularly limited as long as the imprint material is in a homogeneous state by mixing the (A) component, the (B) component, and the (C) component, and as optional components, the (D) component, the (E) component, the (F) component, and the (G) component, and the other additives as required.

The order at the time of mixing the (A) component to the (G) component and optionally mixing the other additives is not particularly limited as long as the homogeneous imprint material is obtained. Examples of the preparation method include a method including the step of mixing the (B) component with the (A) component in a predetermined ratio. Examples of the method also include the step of further mixing the (C) component, the (D) component, the (E) component, the (F) component, and the (G) component with the mixture to form the homogeneous imprint material. Examples of the method also include a method including the step of further adding the other additives as necessary to mix the mixture in an adequate stage of the preparation method.

<Photo-Imprint and Film to which Pattern is Transferred>

The imprint material of the present invention can provide a desired cured film by applying the imprint material onto the substrate and curing the coated film by light. Examples of applying methods include publicly known or widely known methods such as a spin coating method, a dipping method, a flow coating method, an ink jet method, a spray method, a bar coating method, a gravure coating method, a slit coating method, a roll coating method, a transferring printing method, a brush coating, a blade coating method, and an air knife coating method.

Examples of the substrate to which the imprint material of the present invention is applied include substrates made from silicon, glass on which an indium-tin oxide (ITO) film is formed (hereinafter abbreviated as "ITO substrate" in this specification), glass on which a silicon nitride (SiN) film is formed (SiN substrate), glass on which an indium-zinc oxide (IZO) film is formed (IZO substrate), polyethylene terephthalate (PET), triacetyl cellulose (TAC), acrylic, plastic, glass, quartz, and ceramic. Flexible substrates having flexibility can also be used. Examples of the flexible substrates include triacetyl cellulose, polyethylene terephthalate, polymethyl methacrylate, a cyclo-olefin-(co)polymer, polyvinyl alcohol, polycarbonate, polystyrene, a polyimide, a polyamide, a polyolefin, polypropylene, polyethylene, polyethylene naphthalate, polyether sulfone, and a copolymer made from combination of these polymers.

The light source that cures the imprint material of the present invention is not particularly limited, and examples of the light source include a high-pressure mercury vapor lamp, low-pressure mercury vapor lamp, an electrodeless lamp, a metal halide lamp, a KrF excimer laser, an ArF excimer laser, a $F_2$ excimer laser, electron beams (EB), and extreme ultraviolet (EUV). Generally, the wavelengths of a G-line of 436 nm, an H-line of 405 nm, an I-line of 365 nm, and GHI mixed lines can be used. An exposure amount is preferably 30 mJ/cm$^2$ to 2000 mJ/cm$^2$ and more preferably 30 mJ/cm$^2$ to 1000 mJ/cm$^2$.

When the solvent of the (F) component is used, a process for baking can be added so that the solvent is evaporated for at least one of the coating film before light irradiation and the cured film after light irradiation. The baking device is not particularly limited as long as the coating film can be baked using the device such as a hot plate, an oven, and a furnace under an adequate atmosphere, that is, under air or inert gas such as nitrogen and in vacuum. A baking temperature for evaporating the solvent is not particularly limited, and the baking can be carried out, for example, at 40° C. to 200° C.

The device for carrying out the photo-imprint is not particularly limited as long as an intended pattern can be obtained. For example, the following method can be used. The method for carrying out the photo-imprint includes the steps of bonding the substrate and the mold by pressure with a roller in a commercially available device such as ST50 manufactured by TOSHIBA MACHINE CO., LTD., Sindre (registered trademark) 60 manufactured by OBDUCAT AB, and NM-0801HB manufactured by MEISYO KIKO Co., Ltd.; and releasing the cured film from the mold after photo-curing.

Examples of the mold material used in the photo-imprint used in the present invention include quartz, silicon, nickel, alumina, carbonyl silane, and glassy carbon. However, the mold material is not particularly limited as long as the intended pattern can be obtained. In order to improve the mold release property, mold release treatment in which the thin film of a fluorine-based compound is formed on the surface of a mold may be carried out. Examples of a mold release agent used for the mold release treatment include OPTOOL (registered trademark) HD and OPTOOL DSX manufactured by DAIKIN INDUSTRIES, LTD. The mold release agent is not particularly limited to the mold release agents as long as the intended pattern can be obtained.

The pattern size of the photo-imprint is in nano-meter order and specifically the size is in a pattern size of less than 1 micron.

In the present invention, the 90° peeling test for evaluating the mold release force is a test in which generally, a bonding body (in the present invention, corresponding to the cured film formed from the imprint material) is bonded to a bonded body (in the present invention, corresponding to the film) and a resistance force (tensile force) generated at the time of peeling the bonding body after predetermined time in a 90° direction at a predetermined peeling speed is measured. Usually, the measurement is carried out according to the evaluation method with reference to JIS Z0237. The mold release force can be evaluated from a value obtained by converting the resistance force measured in this test into a resistance force per width of the bonded body.

In the test, the imprint material of the present invention is applied onto a film, the coating film on the film is bonded to the surface of a mold having unevenness, subsequently the coating film is photo-cured with the surface of the mold having unevenness bonding thereto, thereafter the cured film on the film is peeled at 90° from the surface of the mold having unevenness, and thus, the mold release force is measured. The mold release force, that is, a value obtained by converting a load when the cured film on the film is peeled from the surface of the mold having unevenness into a value per 1 cm of the width of the film, is preferably more than 0 g/cm and 0.5 g/cm or less, and more preferably 0.4 g/cm or less.

The film which is thus prepared from the imprint material of the present invention and to which a pattern is transferred, a semiconductor device including the film, and an optical member, a solid state imaging element, an LED device, a solar cell, a display, and an electronic device each of which includes the film on a substrate are also within the scope of the present invention.

EXAMPLES

Hereinafter, the present invention is further described in detail with reference to Examples and Comparative Examples. The present invention, however, is not limited to these Examples.

Preparation of Imprint Material

Example 1

5 g of NK Ester APG-700 (hereinafter abbreviated as "APG-700" in this specification) (manufactured by Shin-Nakamura Chemical Co., Ltd.), and 0.05 g of BYK 333 (manufactured by BYK Japan KK) (1 phr to the mass of APG-700) were prepared and these were mixed. To the mixture, 0.125 g of Lucirin (registered trademark) TPO (manufactured by BASF Japan Ltd.) (hereinafter abbreviated as "Lucirin TPO" in this specification) (2.5 phr to the mass of APG-700) was added to prepare an imprint material PNI-a1.

Example 2

An imprint material PNI-a2 was prepared in the same manner as Example 1 except that APG-700 in Example 1 was replaced by FANCRYL (registered trademark) FA-023M (hereinafter abbreviated as "FA-023M" in this specification) (manufactured by Hitachi Chemical Industry Co. Ltd).

Example 3

An imprint material PNI-a3 was prepared in the same manner as Example 1 except that APG-700 in Example 1 was replaced by NK Economer A-1000PER (hereinafter abbreviated as "A-1000PER" in this specification) (manufactured by Shin-Nakamura Chemical Co., Ltd.).

Example 4

0.5 g of KAYARAD (registered trademark) DPEA-12 (hereinafter abbreviated as "DPEA-12" in this specification) (manufactured by Nippon Kayaku Co., Ltd.), 2 g of UA-306H (hereinafter abbreviated as "306H" in this specification) (manufactured by Kyoeisha Chemical Co., Ltd.), 2.5 g of APG-700, and 0.05 g of BYK-333 (1 phr to the total mass of DPEA-12, 306H, and APG-700) were prepared and these were mixed. To the mixture, 0.125 g of Lucirin TPO (2.5 phr to the total mass of DPEA-12, 306H, and APG-700) was added to prepare an imprint material PNI-a4.

Example 5

An imprint material PNI-a5 was prepared in the same manner as Example 4 except that the amount of BYK-333 in Example 4 was changed to 0.1 g (2 phr to the total mass of DPEA-12, 306H, and APG-700).

Example 6

An imprint material PNI-a6 was prepared in the same manner as Example 4 except that APG-700 in Example 4 was replaced by A-1000PER and the amount of BYK-333 in Example 4 was changed to 0.025 g (0.5 phr to the total mass of DPEA-12, 306H, and A-1000PER).

Example 7

An imprint material PNI-a7 was prepared in the same manner as Example 6 except that the amount of BYK-333 in Example 6 was changed to 0.05 g (1 phr to the total mass of DPEA-12, 306H, and A-1000PER).

Example 8

An imprint material PNI-a8 was prepared in the same manner as Example 6 except that the amount of BYK-333 in Example 6 was changed to 0.1 g (2 phr to the total mass of DPEA-12, 306H, and A-1000PER).

Example 9

2.25 g of 306H and 2.75 g of A-1000PER were prepared and these were mixed. To the mixture, 0.05 g of BYK-333 (1 phr to the total mass of 306H and A-1000PER) and 0.125 g of Lucirin TPO (2.5 phr to the mass of 306H and A-1000PER) were added to prepare an imprint material PNI-a9.

Example 10

1.25 g of DPEA-12, 1.25 g of KAYARAD (registered trademark) PET-30 (hereinafter abbreviated as "PET30" in this specification) (manufactured by Nippon Kayaku Co., Ltd.) and 2.5 g of A-1000PER were prepared and these were mixed. To the mixture, 0.1 g of BYK-333 (2 phr to the total mass of DPEA-12, PET30, and A-1000PER) and 0.125 g of Lucirin TPO (2.5 phr to the mass of DPEA-12, PET30, and A-1000PER) were added to prepare an imprint material PNI-a10.

Example 11

2 g of PET30 and 3 g of A-1000PER were prepared and these were mixed. To the mixture, 0.1 g of BYK-333 (2 phr to the total mass of PET30 and A-1000PER) and 0.125 g of Lucirin TPO (2.5 phr to the mass of PET30 and A-1000PER) were added to prepare an imprint material PNI-a11.

Example 12

1.5 g of NK Ester A-200 (hereinafter abbreviated as "A-200" in this specification) (manufactured by Shin-Nakamura Chemical Co., Ltd.), and 3 g of A-1000PER, and 0.5 g of DPEA-12 were prepared and these were mixed. To the mixture, 0.05 g of BYK-333 (1 phr to the total mass of A-200, A-1000PER, and DPEA-12) and 0.125 g of Lucirin TPO (2.5 phr to the mass of A-200, A-1000PER, and DPEA-12) were added to prepare an imprint material PNI-a12.

Example 13

1.5 g of A-200, 2.5 g of A-1000PER, and 1 g of DPEA-12 were prepared and these were mixed. To the mixture, 0.05 g of BYK-333 (1 phr to the total mass of A-200, A-1000PER, and DPEA-12) and 0.125 g of Lucirin TPO (2.5 phr to the mass of A-200, A-1000PER, and DPEA-12) were added to prepare an imprint material PNI-a13.

Example 14

1.5 g of A-200, 2 g of A-1000PER, and 1.5 g of DPEA-12 were prepared and these were mixed. To the mixture, 0.05 g of BYK-333 (1 phr to the total mass of A-200, A-1000PER, and DPEA-12) and 0.125 g of Lucirin TPO (2.5 phr to the mass of A-200, A-1000PER, and DPEA-12) were added to prepare an imprint material PNI-a14.

Example 15

1.5 g of A-200, 1.5 g of A-1000PER, and 2 g of DPEA-12 were prepared and these were mixed. To the mixture, 0.05 g of BYK-333 (1 phr to the total mass of A-200, A-1000PER, and DPEA-12) and 0.125 g of Lucirin TPO (2.5 phr to the mass of A-200, A-1000PER, and DPEA-12) were added to prepare an imprint material PNI-a15.

Example 16

1.5 g of A-200, 1 g of A-1000PER, and 2.5 g of DPEA-12 were prepared and these were mixed. To the mixture, 0.05 g of BYK-333 (1 phr to the total mass of A-200, A-1000PER, and DPEA-12) and 0.125 g of Lucirin TPO (2.5 phr to the mass of A-200, A-1000PER, and DPEA-12) were added to prepare an imprint material PNI-a16.

Example 17

1.5 g of A-200, 0.5 g of A-1000PER, and 3 g of DPEA-12 were prepared and these were mixed. To the mixture, 0.05 g of BYK-333 (1 phr to the total mass of A-200, A-1000PER, and DPEA-12) and 0.125 g of Lucirin TPO (2.5 phr to the mass of A-200, A-1000PER, and DPEA-12) were added to prepare an imprint material PNI-a17.

Example 18

1 g of A-200, 1.5 g of A-1000PER, and 2.5 g of DPEA-12 were prepared and these were mixed. To the mixture, 0.05 g of BYK-333 (1 phr to the total mass of A-200, A-1000PER, and DPEA-12) and 0.125 g of Lucirin TPO (2.5 phr to the mass of A-200, A-1000PER, and DPEA-12) were added to prepare an imprint material PNI-a18.

Example 19

1 g of A-200, 1 g of A-1000PER, and 3 g of DPEA-12 were prepared and these were mixed. To the mixture, 0.05 g of BYK-333 (1 phr to the total mass of A-200, A-1000PER, and DPEA-12) and 0.125 g of Lucirin TPO (2.5 phr to the mass of A-200, A-1000PER, and DPEA-12) were added to prepare an imprint material PNI-a19.

Comparative Example 1

5 g of 306H, 0.05 g of BYK-333 (1 phr to the mass of 306H), and 0.125 g of Lucirin TPO (2.5 phr to the mass of 306H) were prepared and these were mixed to prepare an imprint material PNI-b1.

Comparative Example 2

An imprint material PNI-b2 was prepared in the same manner as Comparative Example 1 except that the amount of BYK-333 in Comparative Example 1 was changed to 0.1 g (2 phr to the mass of 306H).

Comparative Example 3

An imprint material PNI-b3 was prepared in the same manner as Comparative Example 1 except that 306H in Comparative Example 1 was replaced by PET30.

Comparative Example 4

An imprint material PNI-b4 was prepared in the same manner as Comparative Example 2 except that 306H in Comparative Example 2 was replaced by PET30.

Comparative Example 5

0.5 of DPEA-12, 2 g of 306H, and 2.5 g of APG-700 were prepared and these were mixed. To the mixture, 0.125 g of Lucirin TPO (2.5 phr to the total mass of DPEA-12, 306H, and APG-700) was added to prepare an imprint material PNI-b5.

Comparative Example 6

An imprint material PNI-b6 was prepared in the same manner as Comparative Example 5 except that APG700 in Comparative Example 5 was replaced by A-1000PER.

[Mold Release Treatment of Mold]

A moth-eye pattern mold made from nickel and having a pitch of 250 nm and a height of 250 nm (manufactured by InnoX Co., Ltd.) and a silicon wafer were immersed in the solution made by diluting OPTOOL (registered trademark) DSX (manufactured by DAIKIN INDUSTRIES, LTD.) with Novec (registered trademark) HFE-7100 (hydrofluoro ether, manufactured by Sumitomo 3M Ltd.) (hereinafter abbreviated as "Novec HFE-7100" in this specification) to 0.1% by mass, and were treated using a constant temperature and constant humidity device at a temperature of 90° and a humidity of 90 RH % for 1 hour. Thereafter, the treated mold and silicon wafer were rinsed with Novec HFE-7100 and then dried with air.

[Photo-Imprint and Mold Release Force Test]

Each imprint material obtained in Examples 1 to 19 and Comparative Examples 1 to 6 was applied onto a triacetyl cellulose film (FUJITAC (registered trademark) manufactured by FUJIFILM Corporation was used) (hereinafter abbreviated as "TAC film" in this specification) having a thickness of 80 μm using a bar coater (Full Automatic Film Applicator KT-AB3120, manufactured by COTEC CORPORATION). The coating film on the TAC film was bonded to the mold-release treated moth-eye pattern mold by pressure with a roller. Subsequently, photo-curing of the coating film was carried out through a light exposure at 350 mJ/cm$^2$ from the TAC film side using an electrodeless uniform radiation device (QRE-4016A, manufactured by ORC MANUFACTURING CO., LTD.). With reference to JIS Z0237, the 90° peeling test was carried out to measure a load when the cured film formed on the TAC film bonded to the surface of the mold having unevenness is completely peeled from the surface of the mold having unevenness. A load per film width of 1 cm was calculated and the obtained value was determined to be the mold release force (g/cm). The results are shown in Table 1.

[Scratch Test Using Steel Wool]

A scratch test using steel wool was carried out for the cured film obtained after the mold release force test. A test device manufactured by DAIEI KAGAKU SEIKI MFG. CO., LTD was used and #0000 steel wool was used. The load per unit area was set to 20.4 g/cm$^2$ and the steel wool was reciprocated 10 times. The number of scratches after scratching operation was evaluated as indicated below. The results are shown in Table 1.

0 to 5: A
6 to 10: B
11 to 20: C
21 to 30: D
31 to 40: E

[Measurement of Transmittance]

Each imprint material obtained in Examples 1 to 19 and Comparative Examples 1 to 6 was applied onto a quartz substrate by spin coating. The coated film was bonded to the mold-release treated silicon wafer and the bonded sample was placed in the nano-imprint device (NM-0801HB, manufactured by MEISYO KIKO Co., Ltd). Bubbles in the coated film were removed by pressurizing to 100 N over 10 seconds and the pressure was removed over 10 seconds. A light exposure at 350 mJ/cm$^2$ was then carried out using the electrodeless uniform radiation device. Subsequently, the silicon wafer was peeled off and a transmittance was measured for the coated film having a thickness of 5 μm prepared on the quartz substrate. The average transmittance in the visible light region was measured using SHIMADSU UV-3600 (manufactured by SHIMADZU CORPORATION). The obtained results are shown in Table 1.

[Fingerprint Wiping-Off Property]

Each imprint material obtained in Examples 1 to 8 and Examples 12 to 19 was applied onto the TAC film having a thickness of 80 μm using the bar coater (Full Automatic Film Applicator KT-AB3120, manufactured by COTEC CORPO- RATION). The coating film on the TAC film is bonded to the mold-release treated moth-eye pattern mold by pressure with a roller. Subsequently, photo-curing of the coated film was carried out through a light exposure at 350 mJ/cm² from the TAC film side using the electrodeless uniform radiation device (QRE-4016A, manufactured by ORC MANUFACTURING CO., LTD.). After the film was released from the mold, the surface of the TAC film opposite to the surface on which the cured film to which the moth-eye pattern was transferred had been formed was painted in black with Supper Lacquer Spray (manufactured by Asahipen Corporation). The following finger print wiping-off test was carried out. An artificial fingerprint liquid (manufactured by TDK Corporation) was attached to the moth-eye pattern on the cured film formed on the TAC film. Subsequently, BEMCOT (registered trademark) M-1 (manufactured by Asahi Kasei Fibers Co., Ltd.) attached to the test device used in the scratch test using steel wool was reciprocated 50 times with a load of 570 g/cm². The fingerprint wiping-off property was determined through visual observation. Wiping in this test was dry wiping. After the wiping-off test, the case where fingerprints were able to be wiped off was determined to be ○, whereas the case where fingerprints were not able to be wiped off, that is, the fingerprints remained was determined to be x. The results are shown in Table 2.

TABLE 1

|  | Mold release force (g/cm) | Scratch resistance using steel wool | Transmittance (%) |
|---|---|---|---|
| Example 1 | 0.26 | A | 99.4 |
| Example 2 | 0.27 | A | 99.5 |
| Example 3 | 0.26 | A | 99.4 |
| Example 4 | 0.39 | B | 99.5 |
| Example 5 | 0.33 | B | 99.5 |
| Example 6 | 0.35 | A | 99.5 |
| Example 7 | 0.31 | A | 99.5 |
| Example 8 | 0.27 | A | 99.5 |
| Example 9 | 0.33 | A | 99.5 |
| Example 10 | 0.29 | B | 99.4 |
| Example 11 | 0.33 | A | 99.4 |
| Example 12 | 0.15 | A | 99.5 |
| Example 13 | 0.17 | A | 99.5 |
| Example 14 | 0.18 | A | 99.6 |
| Example 15 | 0.20 | A | 99.4 |
| Example 16 | 0.22 | A | 99.5 |
| Example 17 | 0.24 | A | 99.5 |
| Example 18 | 0.18 | A | 99.4 |
| Example 19 | 0.24 | A | 99.5 |
| Comparative Example 1 | 0.71 | D | 99.5 |
| Comparative Example 2 | 0.65 | D | 99.4 |
| Comparative Example 3 | 0.72 | E | 99.4 |
| Comparative Example 4 | 0.65 | E | 99.4 |
| Comparative Example 5 | 1.31 | D | 99.5 |
| Comparative Example 6 | 0.72 | D | 99.5 |

TABLE 2

|  | Fingerprint wiping-off property |
|---|---|
| Example 1 | ○ |
| Example 2 | ○ |
| Example 3 | ○ |
| Example 4 | ○ |
| Example 5 | ○ |
| Example 6 | ○ |
| Example 7 | ○ |
| Example 8 | ○ |
| Example 12 | ○ |
| Example 13 | ○ |
| Example 14 | ○ |
| Example 15 | ○ |
| Example 16 | ○ |
| Example 17 | ○ |
| Example 18 | ○ |
| Example 19 | ○ |

From the results in Table 1, when the imprint materials obtained in Examples 1 to 19 were used, any of the imprint materials showed low mold release forces of 0.5 g/cm or less. The obtained cured films had high transparency in the visible light region, and had a small number of scratches formed after the scratch test using steel wool and thus the scratch resistance of the cured films was confirmed. In contrast, when the imprint materials obtained in Comparative Examples 1 to 6 were used, any of the imprint materials showed mold release forces of far greater than 0.5 g/cm. The obtained cured films had a number of scratches after the scratch test using steel wool. Form the results in Table 2, when the imprint materials obtained in Examples 1 to 8 and Examples 12 to 19 were used, it was confirmed that fingerprint was able to be wiped off from any of the cured films formed from the imprint materials.

As described above, the film obtained from the imprint material of the present invention has low mold release property, has the excellent scratch resistance and fingerprint wiping-off property after the imprint, and has excellent transparency.

INDUSTRIAL APPLICABILITY

The imprint material of the present invention can provide a cured film that is formed from the imprint material and that can be easily peeled from the mold. The cured film is also excellent in scratch resistance, a fingerprint wiping-off property, and transparency. Therefore, the cured film formed from the imprint material can be suitably used for products such as a solar cell, an LED device, and a display.

The invention claimed is:
1. An imprint material comprising:
    a (A) component;
    a (B) component;
    a (C) component; and
    optionally, a (D) component, wherein
    the (A) component is a compound having a propylene oxide unit, an ethylene oxide unit, and two polymerizable groups,
    the (B) component is a silicone compound and is present in an amount of 0.2 phr to 4 phr to the mass of the (A) component and the (D) component when present,
    the (C) component is a photopolymerization initiator, and
    the (D) component is a compound having three or more polymerizable groups.
2. The imprint material according to claim 1, further comprising the compound having three or more polymerizable groups as the (D) component.
3. The imprint material according to claim 1, further comprising a compound having an ethylene oxide unit and two polymerizable groups, as an (E) component.

4. The imprint material according to claim 1, further comprising a surfactant as an (F) component.

5. The imprint material according to claim 1, further comprising a solvent as a (G) component.

6. The imprint material according to claim 1, wherein
the compound of the (A) component is a compound having two groups of at least one selected from the group consisting of an acryloyloxy group, a methacryloyloxy group, a vinyl group, and an allyl group, as the polymerizable groups.

7. The imprint material according to claim 2, wherein
the compound of the (D) component is a compound having three or more groups of at least one selected from the group consisting of an acryloyloxy group, a methacryloyloxy group, a vinyl group, and an allyl group, as the polymerizable groups.

8. The imprint material according to claim 1, wherein
in a test in which the imprint material is applied onto a film, the coating film on the film is bonded to the surface of a mold having unevenness, subsequently the coating film is photo-cured, and thereafter the cured film on the film is peeled at 90° from the surface of the mold having unevenness, a measured mold release force is more than 0 g/cm and 0.5 g/cm or less, the measured mold release force being a value obtained by converting a load when the cured film on the film is peeled from the surface of the mold having unevenness into a value per 1 cm of the width of the film.

9. A film which is formed from the imprint material as claimed in claim 1 and to which a pattern is transferred.

10. An optical member comprising:
the film as claimed in claim 9 to which the pattern is transferred and which is provided on a substrate.

11. A solid state imaging device comprising:
the film as claimed in claim 9 to which the pattern is transferred and which is provided on a substrate.

12. An LED device comprising:
the film as claimed in claim 9 to which the pattern is transferred and which is provided on a substrate.

13. A semiconductor device comprising:
the film as claimed in claim 9 to which the pattern is transferred.

14. A solar cell comprising:
the film as claimed in claim 9 to which the pattern is transferred and which is provided on a substrate.

15. A display comprising:
the film as claimed in claim 9 to which the pattern is transferred and which is provided on a substrate.

16. An electronic device comprising:
the film as claimed in claim 9 to which the pattern is transferred and which is provided on a substrate.

* * * * *